(12) United States Patent
Ligander et al.

(10) Patent No.: US 6,230,401 B1
(45) Date of Patent: May 15, 2001

(54) METHOD AND AN ARRANGEMENT IN AN ELECTRONICS SYSTEM

(75) Inventors: Per Ligander, Göteborg; Leif Bergstedt, Sjömarken, both of (SE)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 0 days.

(21) Appl. No.: 09/143,436

(22) Filed: Aug. 28, 1998

(30) Foreign Application Priority Data

Aug. 29, 1997 (SE) .................................................. 9703128

(51) Int. Cl.$^7$ ....................................................... H05K 3/02
(52) U.S. Cl. ................................ 29/846; 29/830; 29/852; 29/600; 29/601; 174/254
(58) Field of Search ................................. 427/97; 29/852, 29/600, 601, 830, 846; 174/254, 255, 266

(56) References Cited

U.S. PATENT DOCUMENTS

| | | |
|---|---|---|
| 2,800,634 | 7/1957 | Grieg et al. . |
| 3,893,231 * | 7/1975 | Anderson ................................ 29/600 |
| 5,956,843 * | 9/1999 | Mizumoto et al. ..................... 29/852 |

FOREIGN PATENT DOCUMENTS 2665578    2/1992    (FR) .

WO95/21472    8/1995    (WO) .

* cited by examiner

*Primary Examiner*—Lee Young
*Assistant Examiner*—Rick Kiltae Chang
(74) *Attorney, Agent, or Firm*—Burns, Doane, Swecker & Mathis, L.L.P.

(57) ABSTRACT

The invention relates to a method and an apparatus for making an air gap (L, 1*a*) over at least one conductor (5, 5*a*) on a printed circuit board (1), minimizing the losses in the conductor (5, 5*a*). The well known Sequential Build Up (SBU) technology is used, wherein a carrier (3) with the conductor (5, 5*a*) is covered by a photosensitive varnish layer (7, 7*a*). An opening (8, 8*a*) is made in the varnish layer (7, 7*a*) above the conductor (5, 5*a*) by a photographic method. A metal layer (11, 11*a*) is then fastened to the varnish layer (7, 7*a*) covering at least said opening 88, 8*a*) so that an air gap (L, 1$_a$) is formed between the conductor (5, 5*a*) and the metal layer (11, 11*a*). The resulting circuit board (1) has an air gap (L, 1$_a$) well adapted to the conductor (5, 5*a*). According to an alternative inventive method the carrier (3) also comprises a lower conductor (5*b*) placed opposite to the conductor (5*a*) described above on the opposite side of the carrier. In the same way as above the lower carrier (5*b*) is provided with an air gap (1$_b$). A layer (13) of dielectric material can be fixed to the metal layer (11) to obtain a more rigid construction.

10 Claims, 4 Drawing Sheets

METHOD AND AN ARRANGEMENT IN AN ELECTRONICS SYSTEM

TECHNICAL FIELD

The present invention relates to an apparatus and a method for the manufacturing of printed circuit boards for use in electronic systems.

DESCRIPTION OF RELATED ART

A simple printed circuit board consists of a number of layers, one of which is normally a carrier made of a dielectric material. Printed circuit boards also comprise an electrically conductive earth plane. Transmission conductors, below also called conductors, are placed on one side of the carrier and covered by a dielectric material.

An electromagnetic field arises in a way known in the art between the conductor and the earth plane, and thus some of the field being lost in the dielectric material. This is valid especially for printed circuit boards used for high frequencies, when great energy losses may occur and large amounts of heat may be developed in the conductor.

A known method of minimizing these losses that arise in the printed circuit board is to use a dielectric material with favourable properties at high frequencies.

A disadvantage with this method is that it is expensive to use such dielectric materials in a printed circuit board.

Another prior art method is to mill out a recess in the dielectric material with air between the conductor and the earth plane. This air recess significantly reduces the loss in the conductor compared to a solid dielectric.

A disadvantage with this method is that it is complicated and that it is time consuming to make the recess.

The Patent Specification FR 2,665,578 discloses a method of optimizing the ratio between the energy loss and the thermal resistance in conductors in connectors. Recesses in two metal units surround a channel, with one layer of dielectric material between the metal units and two conductors each placed on one side of the dielectric layer in the channel. Thus, the channel is formed by the metal units.

One disadvantage of this method is that it takes up a lot of space in the connector.

U.S. Pat. No. 2,800,634 describes a method for minimizing the losses in a waveguide on, for example, a printed circuit board used at high frequencies. In this method an air gap between an earth plane and the waveguide is utilized, with layers of a dielectric material facing the earth plane building up the air gap between the earth plane and the conductor.

SUMMARY OF THE INVENTION

One problem solved by the invention is the inexpensive and simple creation of an air gap across a conductor on a printed circuit board.

Another problem is to minimize losses arising in a conductor on a printed circuit board.

Yet another problem is the inexpensive and simple way of making an air gap across a conductor on a printed circuit board being used for high frequencies.

The object of the present invention is therefore to achieve an inexpensive and simple manufacturing of an air gap across a conductor on a printed circuit board.

Another object is to minimize losses arising in a conductor on a printed circuit board.

To achieve this according to the present invention a photosensitive varnish layer in the printed circuit board is utilized together with Sequential Build Up (SBU) technology well known in the art. A carrier holding the conductor is covered with the photosensitive varnish layer and an opening is made in the varnish layer over the conductor with a photographic method. An electrically conductive earth plane is attached to the varnish layer with an air gap to the conductor. The resulting printed circuit board has an air gap well adapted to the conductor.

More specifically the method is carried out in the following way: A so called intermediate layer, the varnish layer of a dielectric material, is fixed to a first side of the carrier. On this first side the carrier has said conductor, so that the intermediate layer covers the conductor.

A through opening is made photographically through the intermediate layer of the conductor, said opening being a little wider than the conductor.

A metal layer is then placed on the intermediate layer and fixed to this layer. An air gap is formed between the conductor and the metal layer.

In an alternative method according to the invention the above mentioned carrier also comprises a lower conductor on a second side of the carrier, opposite to the first side of the carrier, said lower conductor being provided with an air gap in the same way as described above.

A layer of a dielectric material, below also called laminate, can, according to an alternative embodiment, be fixed to the metal layer to obtain a more rigid construction.

An advantage of the present invention is that the air gap or air gaps in printed circuit board can be obtained in a simple and inexpensive way, since well known standard materials and the SBU technology which is known in the art, are used.

Another advantage is that the manufacturing time is short, since well known methods and standard materials are used which can easily be found in the market. Furthermore, the air gap is made during the manufacturing of the printed circuit board.

Yet another advantage is that the conductors with the air gaps can easily be created in the intended places on the printed circuit board.

Still another advantage is that the printed circuit board has an air gap well adapted to the conductor.

Another advantage is that the conductors with the air gaps have favourable transmission properties.

Yet another advantage is that, according to the present invention, a high precision in the dimensions of the air gap, and in the position of the air gap on the printed circuit board, are achieved.

The invention will be described in more detail in the following by means of preferred embodiments and with reference to the appended drawings.

DESCRIPTION OF THE PREFERRED EMBODIMENTS

In the following, the invention will be described by way of example, and with reference to the FIGS. 1–2b.

Figure 1:
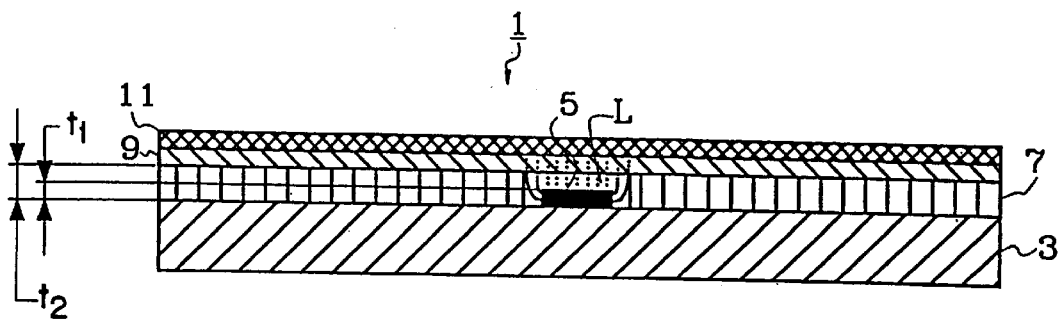
FIG. 1 shows, schematically, a cross section of a printed circuit board comprising a conductor according to the invention.

FIG. 1 is a cross section of a printed circuit board 1 according to the invention. The printed circuit board 1 comprises a carrier 3, a conductor 5, an intermediate layer 7, a glue layer 9 and a metal layer 11.

The carrier 3 is made of a suitable non-conductive material, for example glass fibre armed plastic or glass epoxy FR4.

The conductor 5 has been etched out in the appropriate position from a pattern layer, placed against a first side of the carrier 3. The layer is made from an electrically conductive material, for example, copper. The conductor 5 has a thickness $t_1$, as shown in FIG. 1.

The intermediate layer 7 is fixed to the first side of the carrier, said intermediate layer 7 comprising an opening in which the conductor 5 is placed against the first side of the carrier, as shown in FIG. 1. The opening is a little wider than the conductor 5. The width of the opening is dependent on a number of factors, such as the selection of frequency through the conductor 5, the applications for which the printed circuit board 1 is used, the height of the intermediate layer 7 above the conductor 5 and the selected impedance in the air gap L described below. For example, the width of the opening is 600 μm when the width of the conductor is 200 μm and the frequency of the signal through the conductor 5 is 2 GHz.

The intermediate layer 7, according to the present example, is comprised of a varnish-based photosensitive dielectric, for example pure epoxy, which is a material readily available in the market. The intermediate layer 7 has a thickness $t_2$, which is greater than the thickness $t_1$ of the conductor.

The opening in the intermediate layer 7 is made with a photographic method as will be described in more detail below.

The metal layer 11 is fixed by the glue layer 9 to the intermediate layer 7 as shown in the Figure. The metal layer 11 is made of, for example, copper or aluminium, and the glue layer 9 is, for example, a non-liquid so called prepreg or a bond film.

An air gap L is formed between the upper side of the conductor and the side of the glue layer facing the carrier 3, see also the Figure, since the thickness $t_2$ of the intermediate layer is greater than the thickness $t_1$ of the conductor, according to the invention. This air gap L can be varied as needed by varying the thickness of the conductor 5 and the intermediate layer 7.

In the example above, with the signal frequency 2 GHz, the height of the air gap above the conductor 5 is $t_2-t_1=200$ μm.

An electromagnetic field arises, as common in the art, between the conductor 5 and the metal layer 11. This field is indicated with dots in the Figure. Because of the air gap L around the conductor the losses in the field between the conductor 5 and the metal layer 11 are reduced. Only a small part of the field arises in the intermediate layer 7 around the conductor 5. Also, less heat is developed in the conductor 5, since it is surrounded by an air gap L. The invention is particularly applicable for printed circuit boards used for high frequencies, for example above 1 GHz, when the energy loss in a solid dielectric material can be great and large amounts of heat be developed in the conductor.

The thickness of each layer in the printed circuit board 1 is exaggerated in the Figure, as in the other Figures, for clarity.

In the example described above a layer of a dielectric material, in the following called a laminate layer, may be fixed to the metal layer 11 to obtain a more rigid construction of the metal layer 11. The laminate layer is made of, for example glass epoxy FR4.

A laminate layer, plated with a metal layer may also be placed against the glue layer 9 instead of the metal layer described above.

Figure 2A:
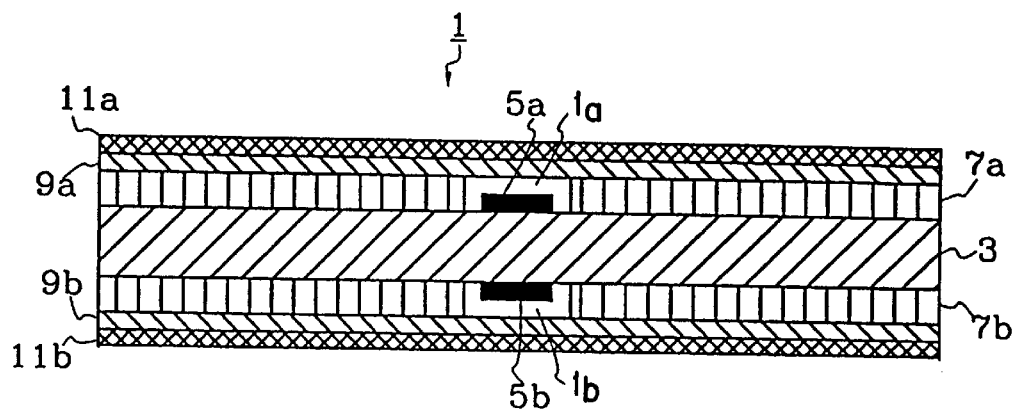
FIG. 2a shows, schematically, a cross section of a printed circuit board comprising two conductors, placed on opposite sides of the printed circuit board, according to the invention.

FIG. 2a shows an alternative embodiment of the invention according to the example above, using an additional conductor 5b, a so called lower conductor. This alternative embodiment is described below with reference to FIG. 1, and the example described above.

The shape of the lower conductor 5b is identical to that of the conductor 5 described above, referred to below as the upper conductor 5a, and the lower conductor 5b has been etched out in a second side of the carrier 3, opposite to the first side of the carrier, opposite to the upper carrier 5a placed on the first side of the carrier.

The upper carrier 5a, the intermediate layer 7, the glue layer 9 and the metal layer 11 are placed as described in connection with FIG. 1. Below, the intermediate layer 7 will be referred to as the upper intermediate layer 7a, the glue layer 9 will be referred to as the upper glue layer 9a and the metal layer 11 will be referred to as the upper metal layer 11a.

A lower intermediate 1 layer 7b is fixed to the second side of the carrier, said lower intermediate layer 7b comprising a lower opening in which the lower conductor 5bis placed against the second side of the carrier. See also FIG. 2a.

The lower intermediate layer 7b is comprised of a varnish-based photosensitive dielectric. The thickness of the intermediate layer is greater than that of the lower conductor.

The lower opening in the lower intermediate layer 7b is made using a photographic method, as will be described in more detail below.

A lower metal layer 11b is fixed, by a lower glue layer 9b to the lower intermediate layer 7b, as shown in the Figure, in the same way as described in connection with FIG. 1.

A lower air gap $1_L$ is formed in this way, in the same way as described above, between the upper side of the lower conductor and the side of the lower glue layer, facing the carrier 3. See also FIG. 2a.

As mentioned above, a laminate layer, below referred to as a lower laminate layer, may be fixed to the lower metal layer 11b to obtain a more rigid construction of the metal layer 11b.

A lower laminate layer, plated with a lower metal layer may also be placed against the lower glue layer 9b instead of the lower metal layer 11b described above.

Figure 2B:
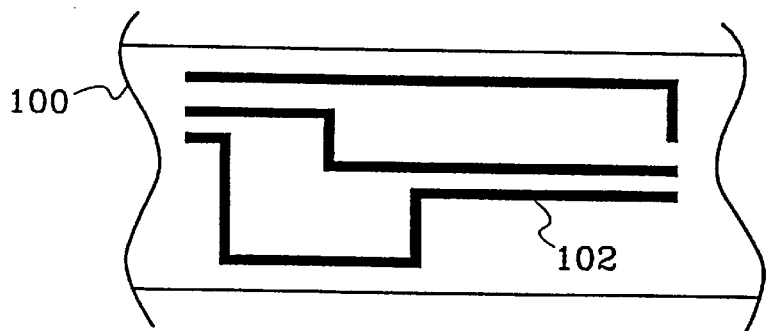
FIG. 2b is an example of a schematic top view of a printed circuit board having a complicated conductor pattern.

FIG. 2b shows an example of a top view of a general printed circuit board 100 having a complicated pattern of etched out conductors 102. According to the invention these conductors 102 may obtain favourable transmission characteristics and air gaps may be made around the conductors 102 in a simple and uncomplicated way, as will be described in more detail below.

In the following example a method according to the invention will be described with reference to FIGS. 3–6 and according to the example described above with reference to FIG. 1.

According to the inventive method the air gap will be made around the conductor placed on the printed circuit board so that the losses in the conductor are reduced. Also less heat will be developed in the conductor since it is surrounded by an air gap. The invention is particularly useful for printed circuit boards used with high frequencies, for example printed circuit boards in back planes in radio base stations.

The air gap around the conductor on the printed circuit board will be made according to the invention using well known standard materials, such as glass epoxy FR4 and pure epoxy, and with a Sequential Build Up (SBU) technology, well known in the art.

The SBU technology utilizes a hard material in a carrier, conductor patterns being built additively on a photosensitive dielectric material arranged against the carrier as a varnish layer. The printed circuit board is made sequentially, that is, one layer at a time is treated while the printed circuit board is being made.

Figure 3:
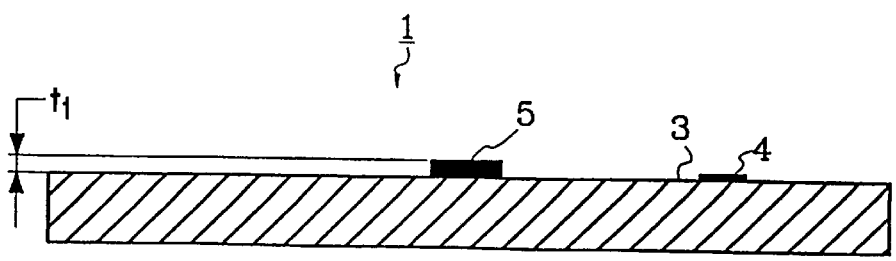
FIG. 3 shows, schematically, a cross section of a carrier comprising a conductor according to the invention.

FIG. 3 shows the carrier 3 of the printed circuit board 1, described above, which is made of a suitable non-conductive material, such as glass fibre armed plastic or glass epoxy FR4.

The conductor 5 and a connection 4 are etched out in the appropriate places from a pattern layer placed against the first side of the carrier. The conductor 5 has a thickness $t_1$, as mentioned above and seen in FIG. 3.

Figure 4:
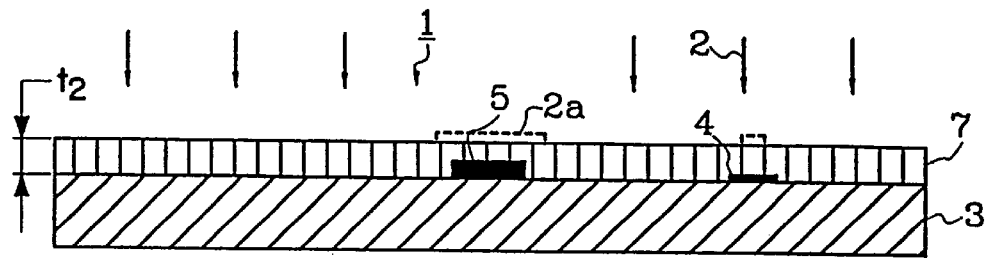
FIG. 4 shows, schematically, a cross-section of the carrier comprising a conductor, with an intermediate layer fixed to the carrier according to the invention.

The first step of the method is to fix the intermediate layer 7 to the first side of the carrier, said intermediate layer 7 covering the conductor 5, as shown in FIG. 4. The intermediate layer 7 according to the present example is comprised of a varnish-based photosensitive dielectric, for example, pure epoxy, which is a material readily available in the market. The thickness $t_2$ of the intermediate layer is greater than the thickness $t_1$ of the conductor.

The upper side of the intermediate layer 7, and the surface covering the conductor 5 and the connection 4 are subjected to UV light 2, so that the upper surface is hardened. When the intermediate layer 7 is subjected to light, the surface covering the conductor 5 and the connection 4 is protected by a mask 2a placed on the intermediate layer 7 so that this surface will not be subjected to light. The mask 2a is indicated with dashed lines in FIG. 4.

Figure 5:
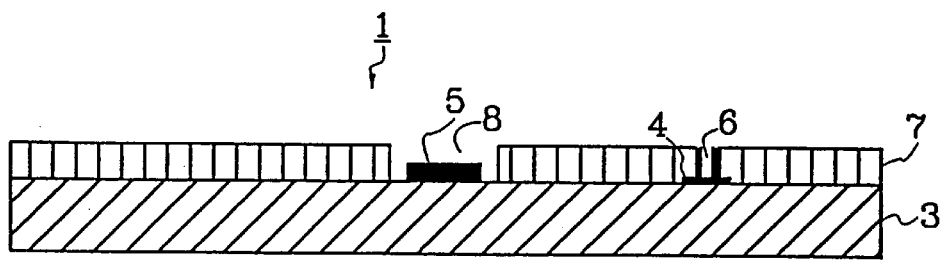
FIG. 5 shows the same cross-section as FIG. 4, with an opening in the intermediate layer around the conductor according to the invention.

An opening 8 in the intermediate layer 7 is then made, see also FIG. 5, by washing off the part of the intermediate layer 7 covering the conductor 5 on the printed circuit board 1, which is the part 2 that was not subjected to the UV light. The opening 8 is a little wider than the conductor 5, as seen in the Figure described above. Said described process for making the opening is a photographic process.

This photographic process for making the opening 8 is carried out at the same time as other openings, for example holes, are made in the printed circuit board 1, making the additional time needed to make the opening 8 small. This method is also easy to use with the printed circuit board 1.

FIG. 5 shows a hole 6 made in a way known in the art at the same time as the opening 8 was made with the photographic process described above, through the intermediate layer near the connection 4. This is shown to emphasize the difference between the invention and the prior art. The hole 6 is plated around the edges with an electrically conductive material to create contact between the connection 4 and another point (not shown) on the printed circuit board 1. The hole 6 and the connection 4 are only shown in FIGS. 3–5.

The next step of the method according to the invention is to place the glue layer 9 described above, against the intermediate layer 7. Since the thickness $t_2$ of the intermediate layer is greater than the thickness $t_1$ of the conductor according to the invention, as mentioned above, an air gap L is formed between the upper side of the conductor and the glue layer. This air gap L may be varied as needed by varying the thickness of the conductor 5 and the metal layer 7.

Figure 6:
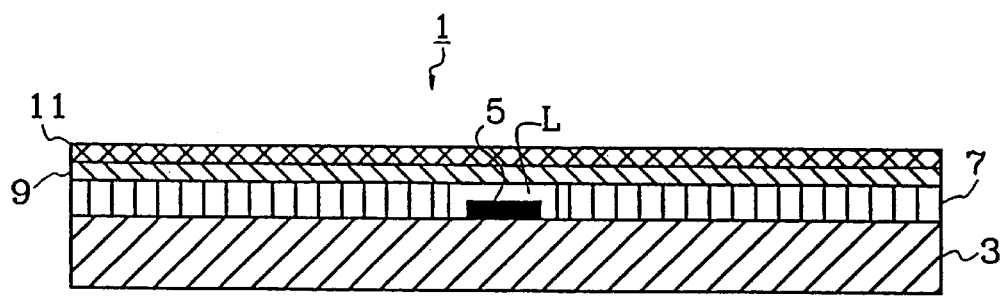
FIG. 6 shows the same cross-section as FIG. 5, with a metal layer fixed to the intermediate layer, according to the invention.

Finally, the metal layer 11 is fixed to the glue layer 9 as shown in FIG. 6. The metal layer 11 is made of, for example, copper or aluminium.

Figure 7:
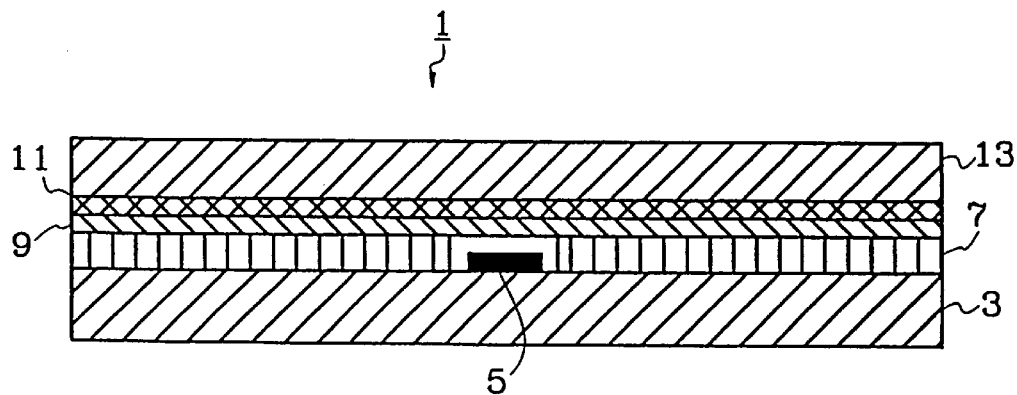
FIG. 7 shows the same cross section as FIG. 6, with a dielectric layer having been placed over the metal layer according to the invention.

As mentioned above a laminate layer 13 may be fixed to the metal layer to obtain a more rigid construction of the metal layer 11. This case is shown in FIG. 7.

A laminate layer can also be placed against the glue layer 9 above, said laminate layer being plated with a metal layer on the surface facing away from the carrier 3, instead of the metal layer 11. This case is not shown in any Figure.

Figure 8:
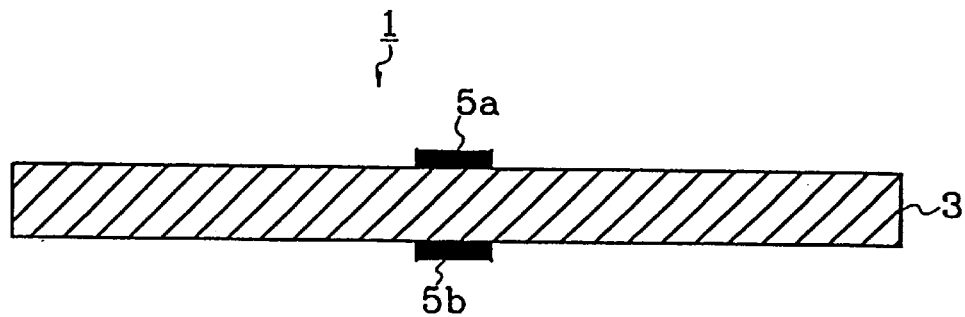
FIG. 8 shows a schematic cross-section of the carrier comprising two conductors on opposite sides, according to the invention.

In an alternative embodiment of the inventive method according to the above example an additional conductor 5b, a so called lower conductor is used, as shown in FIG. 8. This alternative embodiment is described below with reference to FIGS. 8–10 and the example described above.

The shape of this lower conductor 5b is identical to that of the conductor 5 described above, in the following referred to as the upper conductor 5a, and the lower conductor 5b has been etched out on the second side of the carrier, opposite to the upper conductor 5a placed on the first side of the carrier.

In a similar way as described for the above example the method starts with an upper intermediate layer 7a being fixed to the first side of the carrier covering the upper conductor 5a and a lower intermediate layer 7b being fixed to the second side of the carrier, covering the lower conductor 5b. The upper intermediate layer 7a and the lower intermediate layer 7a are referred to below as the intermediate layers 7a, 7b and the upper conductor 5a and the lower conductor 5b are referred to below as the conductors 5a, 5b.

The intermediate layers 7a, 7b are comprised of varnish-based dielectric material as mentioned above. Furthermore, the thickness of the intermediate layers is greater than that of the conductors.

The intermediate layers 7a, 7b are subjected to UV light on the surfaces facing away from the surfaces and on the part of the surface covering the conductors 5a, 5b, so that the surfaces facing away from the carrier are hardened, in the same way as described according to the above example. An upper opening 8a is then made in the upper intermediate layer 7a, and a lower opening 8b from the lower intermediate layer 7b, see also FIG. 9, by washing away the parts of the intermediate layers 7a, 7b covering the conductors 5a, 5b of the printed circuit board 1, which are the parts that were not subjected to UV light. The openings 8a, 8b are a little wider than the conductors 5a, 5b as described in the above example.

The next step of the method is to place an upper glue layer 9a and a lower glue layer 9b, respectively, against the upper intermediate layer 7a and the lower intermediate layer 7b, respectively. Since the thickness of the intermediate layers is greater than that of the conductors according to the invention, air gaps $1_a$, $1_b$ are formed between the conductors 5a, 5b and the corresponding glue layer 9a, 9b. See also FIG. 10.

These air gaps $1_a$, $1_b$ can be varied as needed by varying the thickness of the conductors 5a, 5b and the intermediate layers 7a, 7b, as described above.

Figure 10:
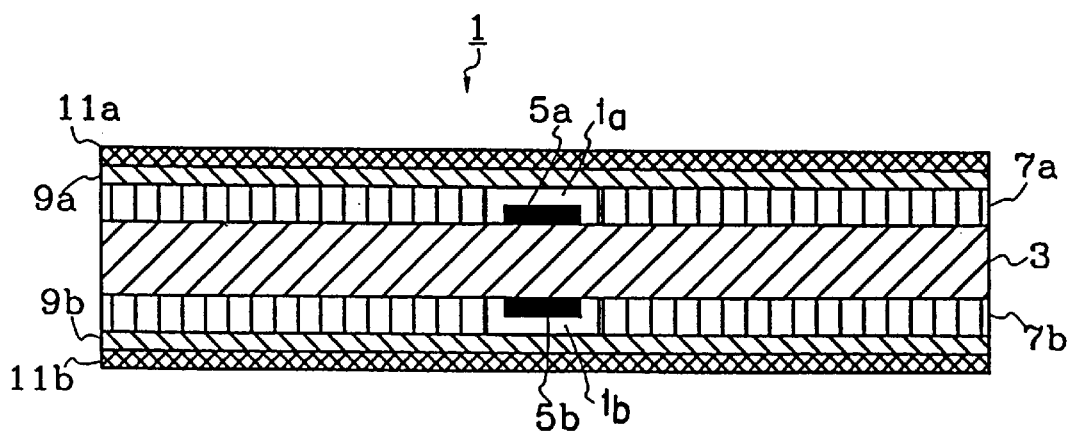
FIG. 10 shows the same cross section as in FIG. 9, with two metal layers having been fixed to the intermediate layers, according to the invention.

In a final step, an upper metal layer 11a and a lower metal layer 11b are fixed to the upper glue layer 9a and the lower glue layer 9b, respectively, as shown in FIG. 10.

As mentioned above an upper and a lower laminate layer may be fixed to the upper metal layer 11a and the lower metal layer 11b to obtain a more rigid construction of the metal layers 11a, 11b.

It is also possible to place an upper and a lower laminate layer against the upper glue layer 9a and the lower glue layer 9b, respectively, in the example above, the upper and the lower laminate layers being plated with an upper and a lower metal layer, respectively, on the surface facing away from the carrier 3 instead of the metal layers 11a, 11b, described above.

Figure 9:
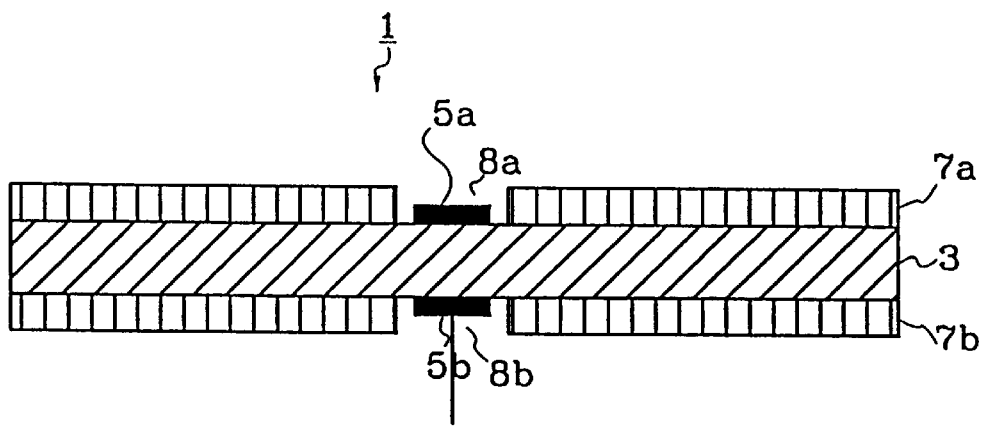
FIG. 9 shows the same cross-section as FIG. 8, with an opening having been formed around the conductors, in two intermediate layers fixed to a first and a second side, respectively, of the carrier, according to the invention.

In connection with FIGS. 11 and 12 yet another embodiment will be described to obtain a shielding of the conductors 5a, 5b described in the above example with reference to FIGS. 8–10.

An advantage of shielding the conductors 5a, 5b is that they become less sensitive to external disturbances and that the conductors 5a, 5b do not disturb the environment.

The conductors 5a, 5b are made on the carrier 3 in the same way as described above in connection with FIG. 8. According to the present example two upper earth conductors 5c are also etched out on the first side of the carrier, one on each side of the upper carrier 5a, as shown in FIG. 11.

In the same way two lower earth conductors 5d are etched out on the second side of the carrier, one on each side of the lower conductor 5b, opposite of the upper earth conductors 5c placed on the first side of the carrier.

The upper earth conductors 5c and the lower earth conductors 5d together will be referred to in the following as the earth conductors 5c, 5d.

In a similar way as described according to the previous example the shielding method is started by fixing the upper intermediate layer 7a to the first side of the carrier so that the upper conductor 5a and the upper earth conductors 5c are covered by the upper intermediate layer 7a. In the same fashion the lower intermediate layer 7b is fixed to the second side of the carrier so that the lower conductor 5b and the lower earth conductors 5d are covered by the lower intermediate layer 7b.

The intermediate layers 7a, 7b are comprised of varnish-based dielectric as mentioned above. Also, the thickness of the intermediate layers is greater than that of the conductors and the earth conductors, respectively.

In the upper intermediate layer 7a upper openings 8c are then made, and in the lower intermediate layer 7b lower openings 8d are made in the same way as described in the previous example. See also FIG. 11. The openings 8c, 8d are made around the conductors 5a, 5b and the earth conductors 5c, 5d, and the openings 8c, 8d are a little wider than the conductors 5a, 5b and the earth conductors 5c, 5d, respectively.

The next step of the method is to place the upper glue layer 9a and the lower glue layer 9b, against the upper intermediate layer 7a and the lower intermediate layer 7b, respectively, in the same way as in the previous example.

The upper metal layer 11a and the lower metal layer 11b are fixed to the upper glue layer 9a and the lower glue layer 9b, respectively. Openings, so called earth conductor openings, are then made through the metal layers 11a, 11b and the glue layers 9a, 9b across the earth conductors 5c, 5d. A method that may be used to make the holes is laser drilling.

Figure 11:
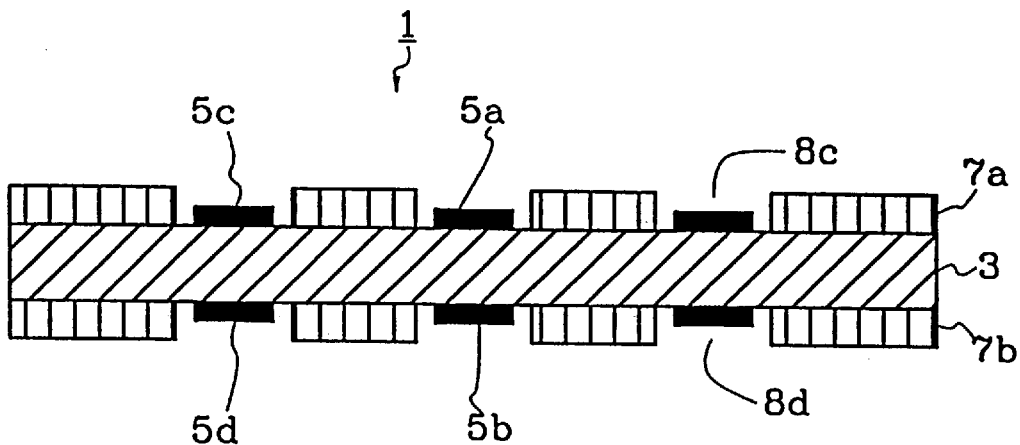
FIG. 11 shows a schematic cross section of the carrier comprising two conductors, on opposite sides, with earth conductors having been placed near the carrier on each side of the two conductors according to the invention.

The earth conductor openings, as shown in FIG. 11, have the same width as the openings 8c, 8d made above in the intermediate layers 7a, 7b around the earth conductors 5c, 5d. The invention is not limited to the earth conductor openings having this width.

In a final step the sides of the earth conductor openings, and the sides of the intermediate layers 7a, 7b facing the earth conductors 5c, 5d, are plated with an electrically conductive material, for example copper, so that the earth conductors 5c, 5d obtain electric contact with the respective metal layer 11a, 11b. See also FIG. 12.

Figure 12:
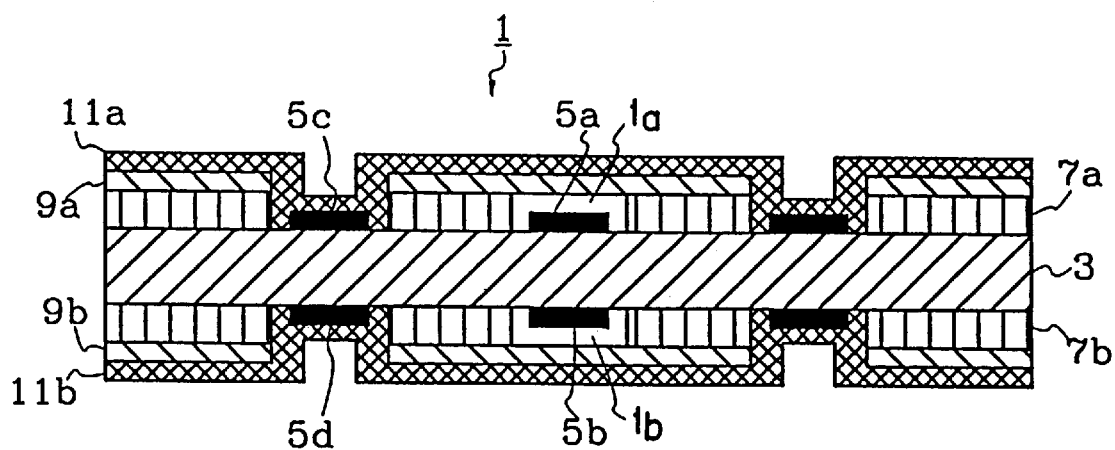
FIG. 12 shows the same cross section as FIG. 11, with the conductors having been shielded according to the invention.

In the present example the top surface of the earth conductors 5c, 5d, that is, the surface facing away from the carrier 3, may also be plated to be sure to obtain said electric contact with the metal layers 11a, 11b, as shown in FIG. 12.

What is claimed is:

1. A method of achieving an air gap around at least one conductor (5), having a thickness, on a printed circuit board comprising a carrier, said conductor being arranged on a first side of the carrier, said method comprising:

fixing an intermediate layer of a varnish-based photosensitive dielectric tight against the first side of the carrier in such a way that the conductor is covered, said intermediate layer having a thickness greater than the thickness of the conductor;

exposing a surface of the intermediate layer facing away from the carrier, to UV light while a portion of the surface arranged above the conductor is protected from the UV light;

making an opening through the intermediate layer around the conductor by washing; and arranging a layer of an electrically conductive material on the intermediate layer covering at least said opening, wherein the opening provides the air gap which separates the conductor from the layer of electrically conductive material.

2. The method according to claim 1, further comprising steps of:

arranging a fastening layer against the intermediate layer;

plating the electrically conductive layer onto a layer of a dielectric material; and fastening the layer of said dielectric material to the fastening layer.

3. The method according to claim 1, further comprising a step of arranging a fastening layer against the intermediate layer so that the electrically conductive layer becomes arranged with and joined to the fastening layer.

4. The method according to claim 3, further comprising a step of fixing a layer of a dielectric material on the electrically conductive layer.

5. The method according to claim 1, wherein the carrier comprises at least a lower conductor arranged on a second side of the carrier, opposite to the first side of the carrier, said lower conductor being identical to the conductor on the first side of the carrier, and arranged opposite to the conductor on the first side of the carrier, said method further comprising steps of:

fixing a lower intermediate layer of a varnish-based photosensitive dielectric material lying tight against the second side of the carrier and in such a way that the lower conductor is covered, a thickness of said intermediate layer being greater than a thickness of the lower conductor;

exposing a surface of the lower intermediate layer facing away from the carrier to UV light, while a part of the surface of said lower intermediate layer arranged above the lower conductor is shielded from the UV light;

making a lower opening through the lower intermediate layer around the lower conductor by washing; and arranging a lower layer of an electrically conductive material on the lower intermediate layer covering at least the lower opening.

6. The method according to claim 5, further comprising the steps of:

arranging a lower fastening layer against the lower intermediate layer;

plating the lower electrically conductive layer onto a lower layer of a dielectric material; and fastening the lower layer of said dielectric material to the lower fastening layer.

7. The method according to claim 5, further comprising a step of arranging a lower fastening layer against the lower intermediate layer so that the lower electrically conductive layer becomes arranged with and joined to the lower fastening layer.

8. The method according to claim 7, further comprising a step of fixing a lower layer of a dielectric material on the lower electrically conductive layer.

9. The method according to claim 5, wherein the carrier carries three conductors, comprising an intermediate conductor placed between two earth conductors, on the first side of the carrier, and three lower earth conductors comprising a lower intermediate conductor placed between two lower earth conductors, on the second side of the carrier, said method comprising a following steps:

making earth openings through a electrically conductive layer down to the earth openings in an intermediate layer near the earth conductors, and through the lower electrically conductive layer down to the lower opening in the lower intermediate layer, respectively; and plating sides of the earth openings, the sides of the openings facing the earth conductors and sides of the lower openings facing the lower earth conductors with an electrically conductive material.

10. The method according to claim 9, further comprising a step of plating a surface of the two earth conductors and the lower earth conductors, respectively, facing away from the carrier, with the electrically conductive material so that the earth conductors and the lower two earth conductors obtains electric contact with the electrically conductive layer and the lower electrically conductive layer, respectively.

* * * * *